United States Patent [19]

Takahashi

[11] Patent Number: 5,293,526
[45] Date of Patent: Mar. 8, 1994

[54] ELECTRONIC EQUIPMENT INCLUDING A PLURALITY OF INDEPENDENTLY POWERED APPARATUS

[75] Inventor: Kenji Takahashi, Yokohama, Japan

[73] Assignee: Canon Kabushiki Kaisha, Tokyo, Japan

[21] Appl. No.: 908,863

[22] Filed: Jul. 1, 1992

Related U.S. Application Data

[63] Continuation of Ser. No. 629,005, Dec. 18, 1990, abandoned, which is a continuation of Ser. No. 327,439, Mar. 23, 1989, abandoned, which is a continuation of Ser. No. 920,438, Oct. 20, 1986, abandoned.

[30] Foreign Application Priority Data

Oct. 25, 1985 [JP] Japan ................................. 237565

[51] Int. Cl.$^5$ ............................................. G08B 21/00
[52] U.S. Cl. ...................... 340/636; 354/484
[58] Field of Search .................. 340/636, 669–664,
340/635, 657, 568, 572, 571, 506, 693, 509,
825.06, 825.17, 825.36, 505, 507, 508; 354/484,
468; 307/18, 43, 25, 26, 85, 86; 361/88;
364/200, 655, 642, 647, 900, 447, 460, 413.01,
413.02, 413.03; 324/500, 510, 511, 537, 555;
379/106, 107, 92

[56] References Cited

U.S. PATENT DOCUMENTS

| | | | |
|---|---|---|---|
| 3,651,471 | 3/1972 | Haselwood | 455/2 |
| 3,708,791 | 1/1973 | Curran | 340/661 |
| 4,249,166 | 2/1981 | Schultz | 340/505 |
| 4,369,435 | 1/1983 | Adachi | 340/506 |
| 4,393,485 | 7/1983 | Redden | 73/151 |
| 4,454,502 | 6/1984 | Fahey et al. | 340/507 |
| 4,477,800 | 10/1984 | O'Brien | 340/505 |
| 4,550,278 | 10/1985 | Yamanaka | 364/185 |
| 4,581,606 | 4/1986 | Mallory | 340/505 |
| 4,662,736 | 5/1987 | Taniguchi | 307/86 |
| 4,697,182 | 9/1987 | Swanson | 340/870.02 |
| 4,712,196 | 12/1987 | Uesugi | 307/66 |
| 4,821,338 | 4/1989 | Naruse et al. | 340/636 |

FOREIGN PATENT DOCUMENTS

| | | | |
|---|---|---|---|
| 3447464 | 12/1984 | Fed. Rep. of Germany | 340/636 |
| 0006330 | 1/1980 | Japan | 354/468 |

*Primary Examiner*—Edward L. Coles, Sr.
*Assistant Examiner*—Jill Jackson
*Attorney, Agent, or Firm*—Fitzpatrick, Cella, Harper & Scinto

[57] ABSTRACT

Electronic equipment comprises a plurality of apparatus each of which is driven by respective power source, voltage detector provided to each of the apparatus which detects the voltage of the power source and a display which indicates, when the voltage drop is detected by the voltage detector, at which apparatus of the plurality of apparatus the drop of source voltage has occurred.

10 Claims, 3 Drawing Sheets

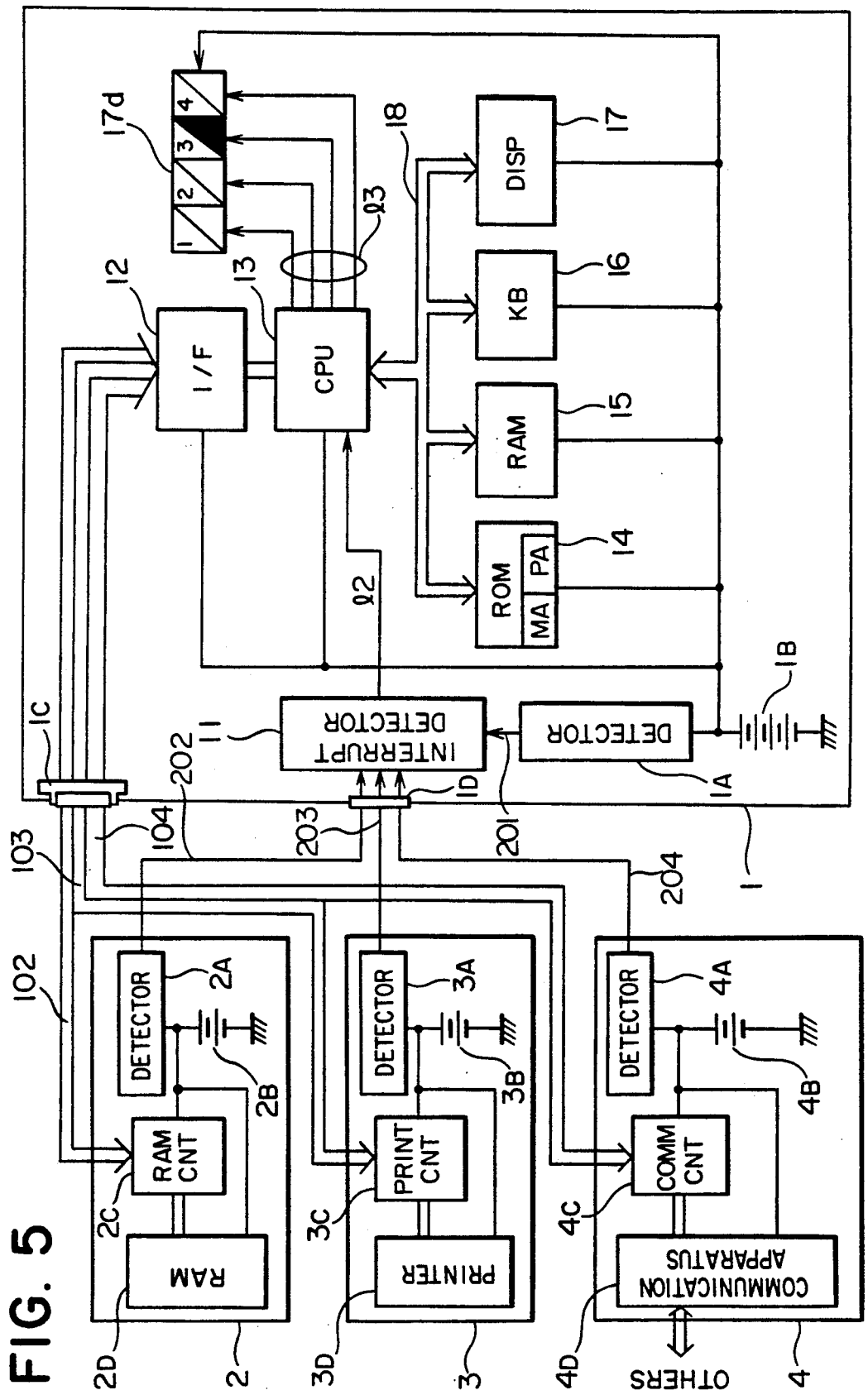

ELECTRONIC EQUIPMENT INCLUDING A PLURALITY OF INDEPENDENTLY POWERED APPARATUS

This application is a continuation of application Ser. No. 07/629,005 filed Dec. 18, 1990, which is a continuation of application Ser. No. 07/327,439 filed Mar. 23, 1989, which is a continuation of application Ser. No. 07/920,438 filed Oct. 20, 1986, now all abandoned.

BACKGROUND OF THE INVENTION

1. Filed of the Invention

The present invention relates to electronic equipment and particularly to electronic equipment which is divided into plural number of units such as main equipment and peripheral apparatus that are driven by batteries.

2. Related Background Art

An electronic apparatus wherein plural number of units driven individually by batteries are connected by connecting means such as connector and the units thus make up one integrated system is often observed with portable equipments. A camera and strobe unit, tuner package for compact taperecorder, hand-held computer and its memory or printer unit etc. are of this type. Particularly in the case of apparatus such as camera, a system is sometimes constructed by connecting plural number of peripheral apparatus such as a strobe and a motor-drive. In the case of equipment of this type so far introduced, when plural number of peripheral apparatus are connected to a main equipment for performance, control system is often so designed that an entire system becomes unoperable when power source voltage decreases with one of the connected units.

Control for the prevention of malfunction of the entire system at the time of disorder of one unit is desired but with the conventional equipment, it has been often impossible to judge at which peripheral unit voltage drop has occurred and thus it has been difficult to estimate the period of stable operation of each unit and find out the appropriate timing for battery exchange. In the extreme case, it has been necessary to dismount the batteries of all apparatus for checking.

SUMMARY OF THE INVENTION

It is one object of the present invention is to provide an electronic equipment wherein, if decrease of source voltage occurs to one of the plural number of apparatus individually driven by respective power sources, the operator can promptly recognize at which apparatus such voltage drop has occurred.

It is another object of the present invention is to provide an electronic equipment which is connectable to plural number of apparatus wherein, if trouble occurs at the power source of one of the plural number of apparatus thus connected, it is possible to promptly determine at which equipment such trouble has occurred.

It is still another object of this invention is to provide an electronic equipment wherein, an operator can recognize the trouble of the battery of an external memory unit backed up by a battery.

It is still another object of this invention to provide an electronic equipment wherein an interrupt signal is received when trouble occurs to the power source and the operator can recognize the occurrence of the trouble.

BRIEF DESCRIPTION OF THE DRAWINGS

FIG. 5 is a block diagram which shows another embodiment of this invention.

DETAILED DESCRIPTION OF THE PREFERRED EMBODIMENTS

Example of Practice

Figure 1:
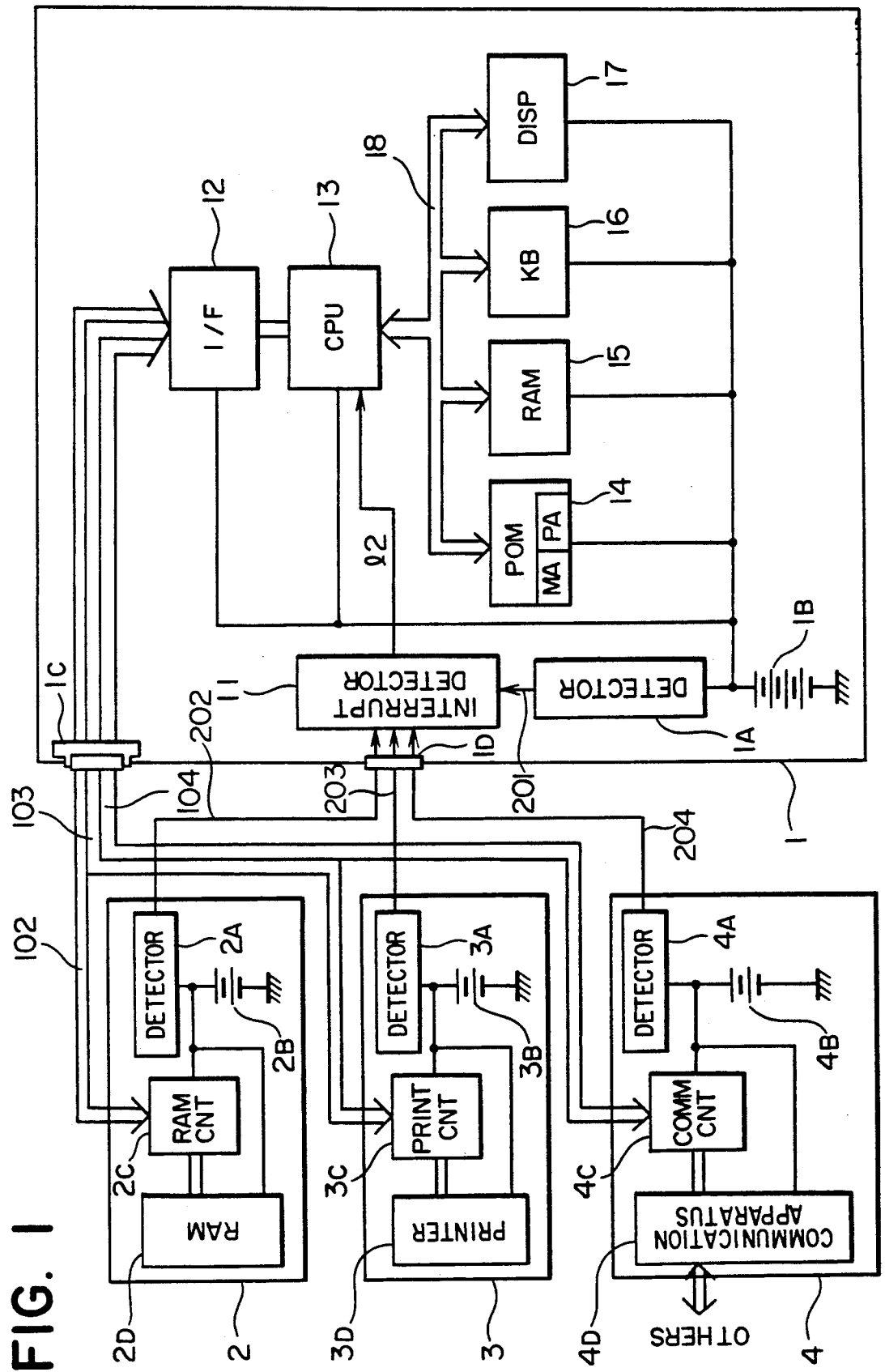
FIG. 1 is a block diagram to illustrate the composition of the system of the electronic equipment of the present inveniton.

Hereunder are given the detailed explanations of this invention according to the example of practice shown in the drawing.

FIG. 1 shows the block diagram of the electronic equipment composed of 4 units represented by the symbols 1 to 4. In the drawing, a unit shown by numeral 1 represents a main equipment, and 12 is an interface circuit to control data exchange between the main equipment 1 and other equipments 2, 3 and 4. Numeral 14 denotes a ROM which stores the control program according to the flow chart of FIG. 3 and the program which controls the entire system of the equipments. Numeral 15 denotes a RAM which stores the data entered from a keyboard 16 and the data processed by CPU 13. Numeral 16 denotes the keyboard which inputs the data and the command. Numeral 17 denotes a display comprising a CRT which displays various data under the control of CPU 13. Numeral 13 denotes a CPU which operates and processes the data input by the keyboard 16 or the data stored in RAM 15 and controls an interface circuit 12, display 17 etc. Numeral 1B denotes a battery which supplies power to be consumed by the main equipment 1. Numeral 1A denotes a voltage detector composed of a comparator etc. which, when voltage of the battery 1B decreases, detects such voltage drop and outputs a signal. Numeral 11 denotes an interrupt detection circuit (interrupt detector), which receives the signal from voltage detectors 1A, 2A, 3A and 4A and outputs interrupt signal to CPU 13 and outputs a signal to identify from which units a particular signal has been received.

Numeral 2 denotes an external memory unit which is connected to the main equipment 1 and supplements the memory capacity of RAM 15. Here numeral 2B denotes a battery which supplies the power consumed by the external memory unit, while numeral 2A denotes voltage detector, like 1A, which detects the decrease of voltage of 2B and outputs the signal to the interrupt detection circuit 11. Numeral 2C denotes a RAM control circuit which controls a RAM 2D.

Numeral 3 denotes a printer unit which is connected to the main equipment 1 to print-out the data. Here numeral 3B denotes a battery same as battery 2B and 3A is the detector same as 2A. Numeral 3D denotes a printer. Numeral 3C denotes a printer control circuit to control a printer 3D.

Numeral 4 denotes a communication unit which transmits the data received from the main equipment 1 to other apparatus or transmits the data received from other apparatus to the main equipment 1. Here numeral 4B denotes a battery same as battery 2A and numeral 4A denotes voltage detector same as voltage detector 2A. Numeral 4C denotes communication control circuit which controls a communication apparatus 4D.

The aforesaid main equipment 1 and the external memory unit 2, printer unit 3 and communication unit 4 are connected by connectors 1C and 1D and via data lines 102, 103 and 104. They exchange data with each other and thus main equipment 1 can detect the decrease of battery voltage of each unit via signal lines 202, 203 and 204.

Figure 2:
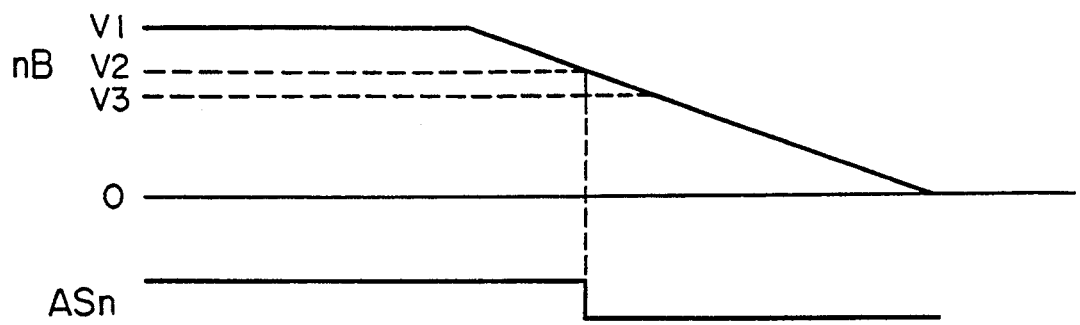
FIG. 2 is a timing chart which illustrates the control actions of the equipment of FIG. 1.
Figure 3:
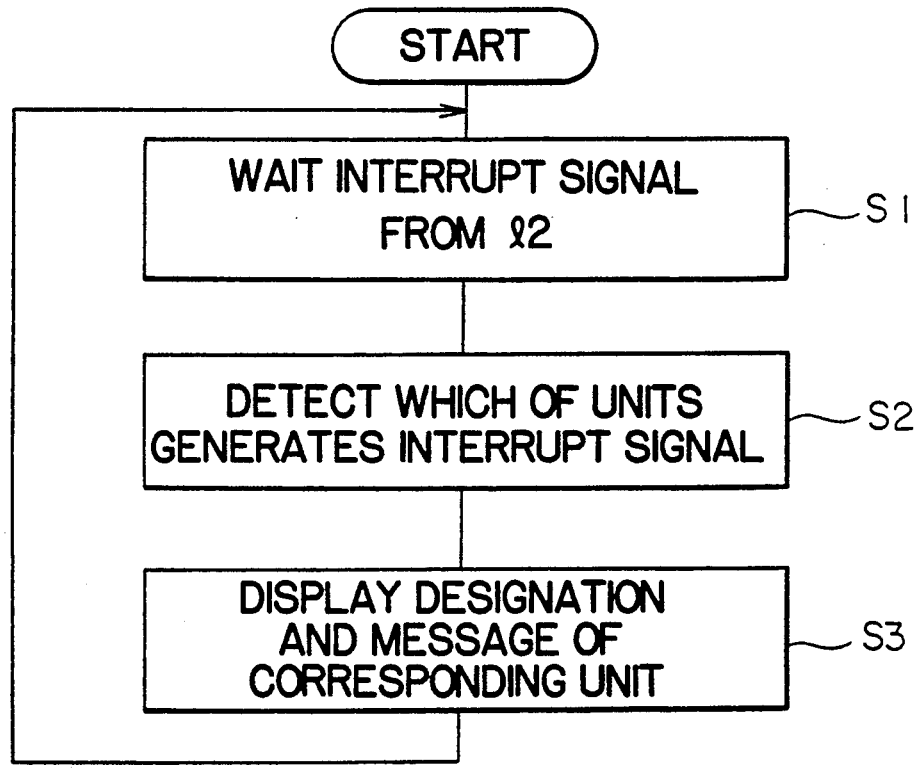
FIG. 3 is the flow chart which indicates the control steps of CPU of FIG. 1.

Next, in reference to the flow charts given in FIG. 2 and FIG. 3, the performance of the system having the aforesaid construction is explained. FIG. 2 indicates the output voltage of one of the batteries 1B to 4B and ASn below them indicates the level of one of the signal lines 201, 202, 203 and 204 which corresponds to the battery selected above. FIG. 3 indicates the flow chart of the control steps of the control program stored in the program area PA of the aforesaid ROM 14.

Figure 4:
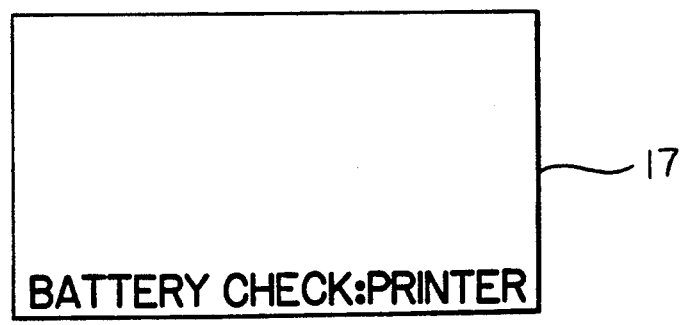
FIG. 4 is a drawing which shows an example of display by this invention.

In step S1 of FIG. 3, when the voltage of one of the batteries 1B to 4B decreases from the level V1 to V2 as shown in FIG. 2, either of the voltage detectors 1A to 4A which corresponds to such battery functions and changes either one of the signal lines 201, 202, 203 and 204 to the low level. Then in step S2, interrupt detection circuit 11 informs CPU 13, via signal line 12, which signal line 201, 202, 203 or 204 has effected the interruption. In step 3, CPU 13 displays such information on the display 17, via data bus 18, using the prescribed routine for the display control, and thus indicates at which apparatus, the voltage drop has occurred. The contents of message memory area MA of ROM 14 are displayed on the display 17. FIG. 4 shows an example of such display. In this way the operator can quickly identify the battery of the apparatus which must be exchanged and thus battery exchange word can be done with certainty. In addition, by observing the display 17, it is possible to forecast the period of stable operation of each unit and be prepared for the next battery exchange.

In FIG. 2, symbol V3 indicates a voltage level at which the operation of the unit becomes unstable. With such composition, an alarm is emitted while the output voltage of the battery is still in the state of stable operation, thus guaranteeing a sound operation of the system. The above composition can be realized with the electronic equipment which is divided into plural number of units, each of which is driven by a battery.

Another Example of Practice

In the aforesaid explanation, at which battery of the batteries 1B to 4B voltage drop has occurred has been displayed on the screen of display 17 together with the message, but hereunder is given another example of practice of this invention. FIG. 5 shows the outline of such composition For the constructions same as those of FIG. 1, the same numbers as those used in FIG. 1 are given.

The difference from FIG. 1 is that this system has, in addition to the display 17, a display 17d which has a built-in display units such as four LEDs and LCDs to indicate the state of the battery and when it determines by which unit the interruption has been made in step S2 shown in FIG. 3, CPU 13 can identify at which unit the battery voltage has dropped by flickering the LED of display 17d corresponding to such unit.

Effect of the Invention

As it is evident from the explanation given above, according to this invention it is possible to provide an excellent electronic equipment, composed of plural number of units each of which is driven by a battery, wherein the means to detect the output voltage of the battery of each unit is provided and when the voltage drop of a battery of either one of the units is detected, the alarm means provided to the unit outputs the alarm to indicate at which unit the drop of output voltage has occurrred and because of the employment of such composition, it is possible to promptly identify the unit whose battery should be exchanged and to have the operator execute battery exchange with certainty and in addition thereto, to estimate the stable operation period of each unit.

What is claimed is:

1. Electronic equipment comprising:
   a plural number of independent apparatuses each having a different function from each other, each of which includes at least a signal line for transmitting and receiving information, a battery power source provided to each of said apparatuses, detecting means for detecting trouble of said power source and outputting means for outputting a detection signal as soon as trouble is detected by said detecting means; and
   an information processing apparatus connected to said plural number of apparatuses, said information processing apparatus adapted to transmit through said signal lines said information to and to receive through said signal lines said information sent from any one of said plural number of apparatuses, said information processing apparatus including display means for displaying error information, and means for providing said error information to said display means to indicate that trouble has occurred with said power source of any one of said plural number of independent apparatuses, said information processing apparatus, in response to the reception of said detection signal, displaying said error information on said display means through said means for providing said error information.

2. Electronic equipment according to claim 1, wherein at least one of the plural number of apparatus includes external memory means.

3. Electronic equipment according to claim 1, further comprising a connector for connecting the plural number of apparatuses.

4. Electronic equipment according to claim 1 further comprising memory means for storing character data to be displayed on said display means.

5. Electronic equipment according to claim 1, wherein said display means is an LED.

6. Electronic equipment as set forth in claim 1, further comprising a camera, wherein said camera is equipped with said electronic equipment.

7. Electronic equipment connectable to a plural number of apparatuses comprising:
   signal receiving means connected to the plural number of apparatuses for receiving through interrupt signal lines a signal set from any of the plural number of apparatuses indicating that trouble has occurred;
   transmission means responsive to the signal received from said signal receiving means for transmitting an interrupt signal; and processing means connected to the plural number of apparatuses, having a first port for transmitting through data signal lines information to or for receiving through said data signal lines information sent from any one of the plural number of apparatuses, said processing means being connected to said transmission means and having a second port for receiving through said interrupt signal lines the trouble signal received by said transmission means, said processing means generating a signal indicating at which apparatus the trouble has occurred in response to the interrupt signal transmitted by said transmission means.

8. Electronic equipment as set forth in claim 7, further comprising a camera, wherein said camera is equipped with said electronic equipment.

9. An information processing system comprising:

independent apparatus which includes at least one data signal line for transmitting and receiving information, a battery power source provided to said apparatus, detection means for detecting trouble with said power source, and outputting means for outputting a detecting signal through an interrupt signal line as soon as trouble is detected by said detection means; and an information processing apparatus connected to said independent apparatus, said information processing apparatus adapted to transmit through said at least one data signal line said information to and to receive through said at least one data signal line said information sent from said independent apparatus, said information processing apparatus having a central processing unit having a first port for receiving the information through said at least one data signal line and a second port for receiving the detection signal through said interrupt signal line, said information processing apparatus processing said detection signal received through said second port as an interrupt signal.

10. An information processing system as set forth in claim 9, further comprising a camera equipped with said information processing system.

* * * * *

UNITED STATES PATENT AND TRADEMARK OFFICE
CERTIFICATE OF CORRECTION

PATENT NO. : 5,293,526
DATED : March 8, 1994
INVENTOR(S) : Takahashi

It is certified that error appears in the above-indentified patent and that said Letters Patent is hereby corrected as shown below: On the title page: Item

[30] FOREIGN APPLICATION PRIORITY DATA:

"Oct. 25, 1985 [JP] Japan ................ 237565" should read --Oct. 25, 1985 [JP] Japan ............ 60-237565--.

COLUMN 4:

Line 63, "set" should read --sent--.

Signed and Sealed this

Twenty-ninth Day of November, 1994

Attest:

BRUCE LEHMAN

Attesting Officer     Commissioner of Patents and Trademarks